United States Patent
Hida et al.

(10) Patent No.: US 11,551,774 B2
(45) Date of Patent: Jan. 10, 2023

(54) MEMORY SYSTEM AND METHOD OF CONTROLLING NON-VOLATILE MEMORY

(71) Applicant: Kioxia Corporation, Tokyo (JP)

(72) Inventors: Itaru Hida, Yokohama (JP); Tokumasa Hara, Kawasaki (JP)

(73) Assignee: Kioxia Corporation, Tokyo (JP)

(*) Notice: Subject to any disclaimer, the term of this patent is extended or adjusted under 35 U.S.C. 154(b) by 35 days.

(21) Appl. No.: 17/178,554

(22) Filed: Feb. 18, 2021

(65) Prior Publication Data
US 2022/0076772 A1   Mar. 10, 2022

(30) Foreign Application Priority Data
Sep. 4, 2020   (JP) .............................. JP2020-149012

(51) Int. Cl.
| G11C 29/42 | (2006.01) |
| G11C 29/50 | (2006.01) |
| G11C 29/44 | (2006.01) |

(52) U.S. Cl.
CPC .............. *G11C 29/42* (2013.01); *G11C 29/44* (2013.01); *G11C 29/50004* (2013.01)

(58) Field of Classification Search
CPC ... G11C 29/42; G11C 29/44; G11C 29/50004; G11C 2029/0411
See application file for complete search history.

(56) References Cited

U.S. PATENT DOCUMENTS

| 2003/0101408 | A1  | 5/2003  | Martinian et al. |
| 2006/0002689 | A1* | 1/2006  | Yang ................. G11B 20/10009 |
| 2013/0326263 | A1  | 12/2013 | Alameldeen et al. |
| 2018/0074892 | A1* | 3/2018  | Shappir .................. G11C 29/52 |
| 2018/0260274 | A1  | 9/2018  | Inoue et al. |
| 2020/0019459 | A1* | 1/2020  | Cadloni ................ G06F 3/0619 |
| 2020/0110659 | A1* | 4/2020  | Foley .................. G06F 11/1076 |

* cited by examiner

*Primary Examiner* — Mohammed A Bashar
(74) *Attorney, Agent, or Firm* — Oblon, McClelland, Maier & Neustadt, L.L.P.

(57) ABSTRACT

According to one embodiment, a memory system includes a non-volatile memory provided with a plurality of memory cells, and a memory controller. The memory controller reads data subjected to error-mitigation encoding from the non-volatile memory, the data including determination information indicating whether or not a value is changed by the error-mitigation encoding, executes error-mitigation decoding on the read data, re-executes the error-mitigation encoding on a decoding result obtained by the error-mitigation decoding, and compares the determination information included in the read data with determination information included in data obtained by re-executing the error-mitigation encoding and outputs a comparison result.

20 Claims, 13 Drawing Sheets

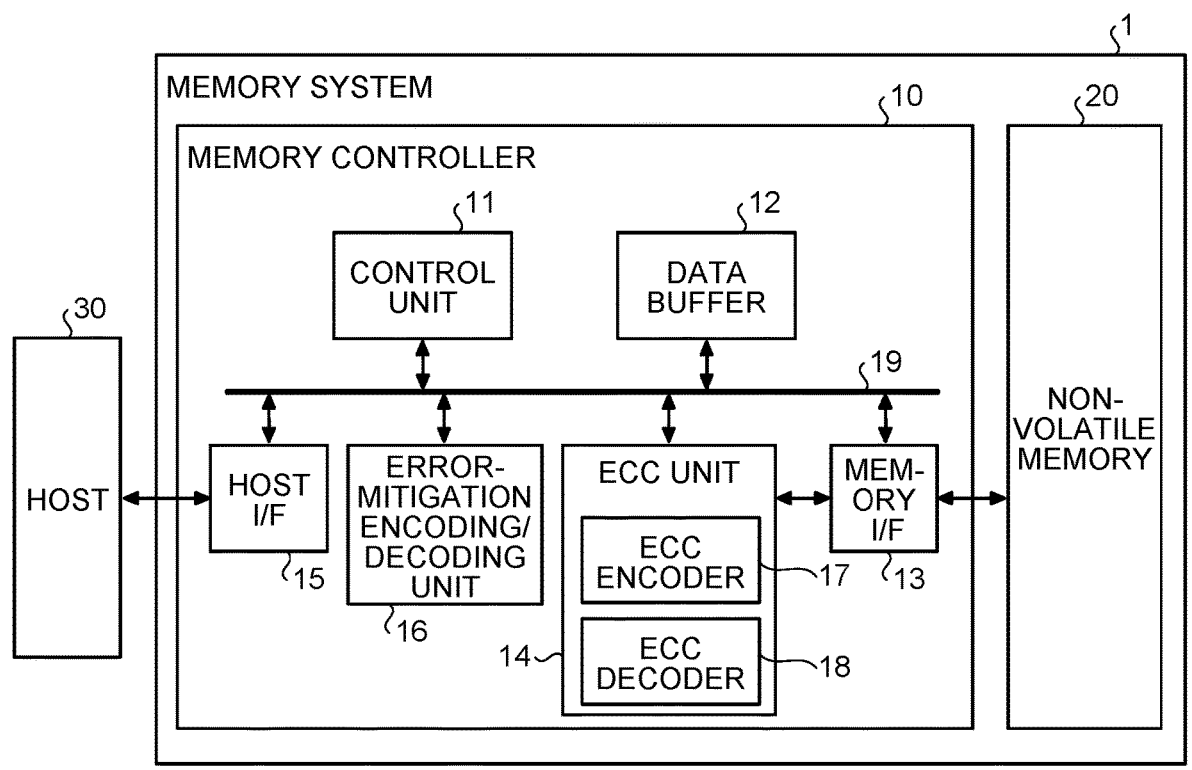

FIG.12
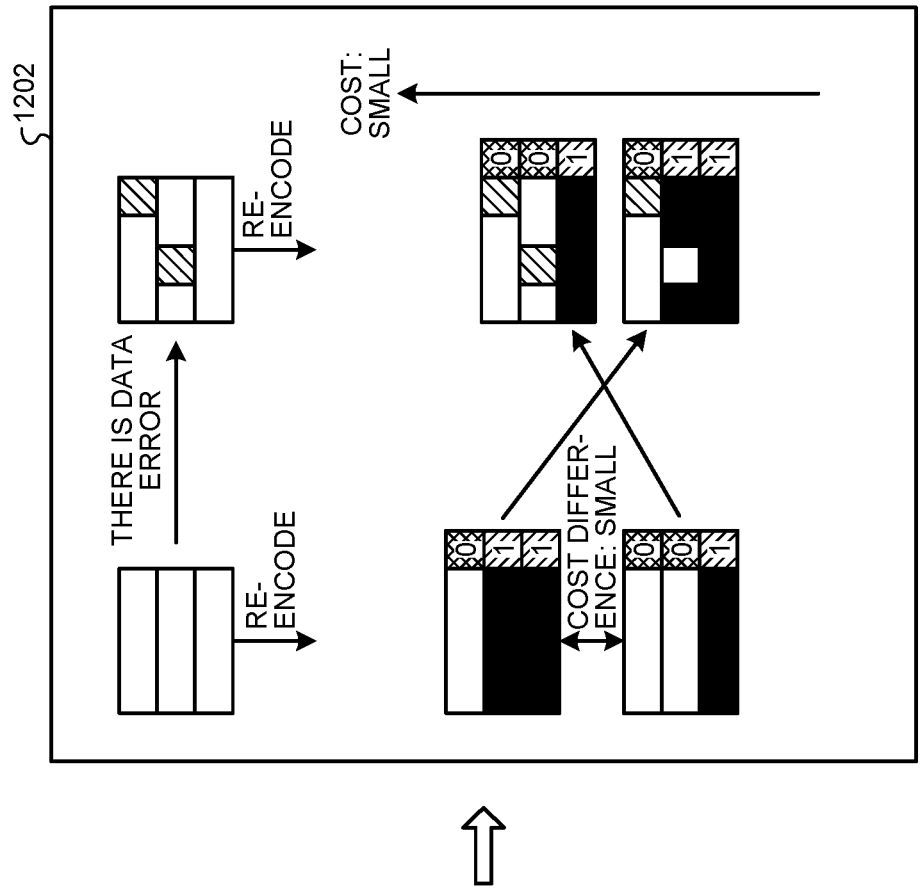
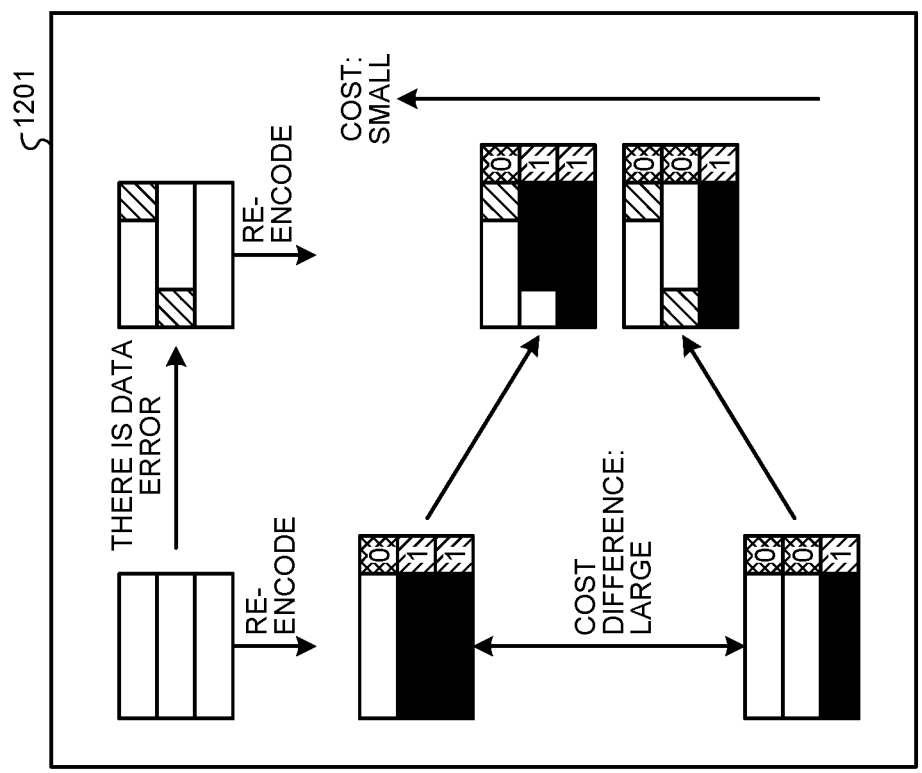

MEMORY SYSTEM AND METHOD OF CONTROLLING NON-VOLATILE MEMORY

CROSS-REFERENCE TO RELATED APPLICATIONS

This application is based upon and claims the benefit of priority from Japanese Patent Application No. 2020-149012, filed on Sep. 4, 2020; the entire contents of which are incorporated herein by reference.

FIELD

Embodiments described herein relate generally to a memory system.

BACKGROUND

In a memory system, error correction encoded data is typically stored, which is to protect data to be stored. Further, in addition to error-correcting encoding, error-mitigation encoding is executed sometimes. The error-mitigation encoding makes it possible to reduce the number of cells programmed to a threshold voltage with unsatisfactory properties and increase the number of cells programmed to a threshold voltage with satisfactory properties.

BRIEF DESCRIPTION OF THE DRAWINGS

FIG. 1 is a block diagram illustrating an exemplary schematic configuration of a memory system according to a first embodiment;

FIG. 2 is a diagram illustrating an example of data coding;

FIG. 12 is a diagram illustrated to describe the effect of a change in costs due to an error in user data;

DETAILED DESCRIPTION

Figure 3:
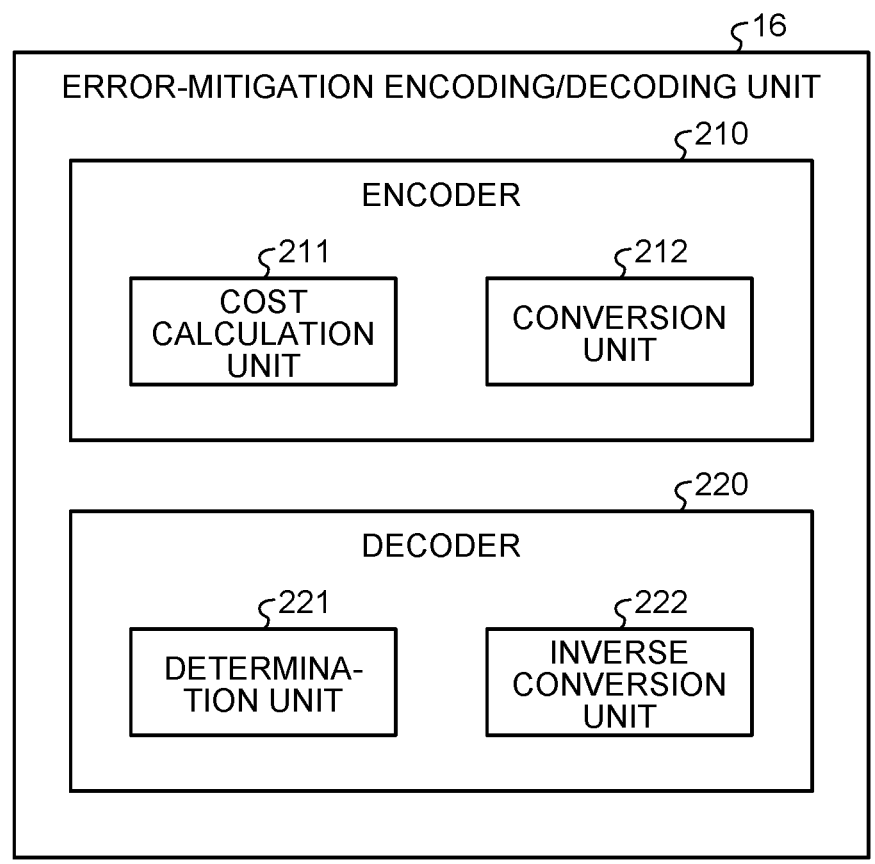
FIG. 3 is a block diagram illustrating an exemplary functional configuration of an error-mitigation encoding/decoding unit.

A memory system according to the present embodiment includes a non-volatile memory provided with a plurality of memory cells, and a memory controller. The memory controller reads data subjected to error-mitigation encoding from the non-volatile memory, the data including determination information indicating whether or not a value is changed by the error-mitigation encoding, executes error-mitigation decoding on the read data, re-executes the error-mitigation encoding on a decoding result obtained by the error-mitigation decoding, and compares the determination information included in the read data with determination information included in data obtained by re-executing the error-mitigation encoding and outputs a comparison result.

Preferred embodiments of a memory system according to the present invention is now described in detail with reference to the accompanying drawings.

First Embodiment

The memory system according to an embodiment is now described in detail with reference to the accompanying drawings. Moreover, embodiments below are not intended to limit the present invention.

The memory system according to the present embodiment is now described in detail with reference to the drawings. FIG. 1 is a block diagram illustrating an exemplary schematic configuration of a memory system according to the present embodiment. As illustrated in FIG. 1, a memory system 1 includes a memory controller 10 and a non-volatile memory 20. The memory system 1 is connectable to a host 30, and FIG. 1 illustrates a state in which the memory system 1 is connected to the host 30. The host 30 can be, in one example, an electronic device such as a personal computer or a mobile terminal.

The non-volatile memory 20 is a non-volatile memory that stores data in a non-volatile manner, and an example thereof includes a NAND flash memory (hereinafter, simply referred to as a NAND memory). The description below exemplifies a case where the NAND memory is used as the non-volatile memory 20. However, it is also possible to use, as the non-volatile memory 20, a storage device other than the NAND memory, such as three-dimensional flash memory, resistive random-access memory (ReRAM), or ferroelectric random-access memory (FeRAM). In addition, the non-volatile memory 20 is not necessarily a semiconductor memory, and the present embodiment is applicable to various types of storage media other than the semiconductor memory.

The memory system 1 can be various types of memory systems provided with the non-volatile memory 20, such as what is called a solid-state drive (SSD) or a memory card having the memory controller 10 and the non-volatile memory 20 configured as one package.

The memory controller 10 controls the writing to the non-volatile memory 20 in response to a request for writing user data from the host 30. Further, the memory controller 10 controls the reading from the non-volatile memory 20 in response to a read request from the host 30. The memory controller 10 is a semiconductor integrated circuit configured as, in one example, a system on a chip (SoC). The memory controller 10 includes a host interface (host I/F) 15, a memory interface (memory I/F) 13, a control unit 11, an error-correcting code (ECC) unit 14, an error-mitigation encoding/decoding unit 16, and a data buffer 12. The host I/F 15, the memory I/F 13, the control unit 11, the ECC unit 14, and the data buffer 12 are connected to each other via an internal bus 19. The entirety or a part of the operations of the respective components in the memory controller 10, which will be described below, can be implemented by a central processing unit (CPU) executing firmware or can be implemented by hardware.

The host I/F 15 performs processing conforming to the interface specification with the host 30 and outputs an instruction received from the host 30, user data to be written, or the like to the internal bus 19. In addition, the host I/F 15 transmits the user data read and restored from the non-volatile memory 20, a response from the control unit 11, or the like to the host 30.

The memory I/F 13 performs write processing to the non-volatile memory 20 on the basis of an instruction from the control unit 11. In addition, the memory I/F 13 performs read processing on the non-volatile memory 20 on the basis of the instruction from the control unit 11.

The data buffer 12 temporarily stores the user data received from the host 30 by the memory controller 10 until it is stored in the non-volatile memory 20. In addition, the data buffer 12 temporarily stores the user data read from the non-volatile memory 20 until it is transmitted to the host 30. For the data buffer 12, it is possible to use, in one example, a general-purpose memory such as static random-access memory (SRAM) or dynamic random-access memory (DRAM). Moreover, the data buffer 12 can be mounted outside the memory controller 10 rather than being built in the memory controller 10.

The control unit 11 performs centralized control of the respective components of the memory system 1. The control unit 11, when receiving an instruction from the host 30 via the host I/F 15, performs control in accordance with the instruction. In one example, the control unit 11 instructs the memory I/F 13 to write the user data and parity to the non-volatile memory 20 in response to the instruction from the host 30. In addition, the control unit 11 instructs the memory I/F 13 to read the user data and parity from the non-volatile memory 20 in response to the instruction from the host 30.

Further, the control unit 11, when receiving a user data write request from the host 30, decides a storage area (memory area) on the non-volatile memory 20 for the user data stored in the data buffer 12. In other words, the control unit 11 manages a destination to write the user data. The association between a logical address of the user data received from the host 30 and a physical address is stored as an address translation table. The physical address indicates the storage area on the non-volatile memory 20 in which the user data is stored.

Further, the control unit 11, when receiving a read request from the host 30, converts the logical address specified by the read request into the physical address using the address translation table mentioned above and instructs the memory I/F 13 to perform reading using the physical address.

In NAND memory, the write and read operations are typically performed in data units called pages, and the erase operation is performed in predetermined data units larger than pages. In the present embodiment, a plurality of memory cells connected to an identical word line is referred to as a memory cell group. In the case where the memory cell is a single-level cell (SLC), one memory cell group corresponds to one page. In the case where the memory cell is a multi-level cell (MLC), one memory cell group corresponds to a plurality of pages. Moreover, in this description, an example of MLC includes a triple-level cell (TLC) that stores three bits in one memory cell, a quad-level cell (QLC) that stores four bits in one memory cell, or the like. In addition, each memory cell is connected to both a word line and a bit line. Thus, it is possible to identify each memory cell with an address that identifies the word line and an address that identifies the bit line.

The user data transmitted from the host 30 is transferred to the internal bus 19 and temporarily stored in the data buffer 12.

The error-mitigation encoding/decoding unit 16 performs error-mitigation encoding on the user data temporarily stored in the data buffer 12 before storing the non-volatile memory 20 in accordance with, in one example, an error-mitigation encoding scheme specified by the control unit 11. In addition, the error-mitigation encoding/decoding unit 16 performs error-mitigation decoding on the received word that is read from the non-volatile memory 20. The unit to which the error-mitigation encoding is applied can be the entire memory cell or a word line.

The error-mitigation encoding is the processing of giving a deviation to a threshold voltage of a memory cell by converting data to be written. This makes it possible to reduce the number of cells programmed to a threshold voltage with unsatisfactory properties in terms of cell exhaustion and a bit error rate (BER) and increase the number of cells programmed to a threshold voltage with satisfactory properties. The cell exhaustion means the cell-to-cell interference effect and exhaustion of memory cells due to writing and erasing.

The error-mitigation encoding is sometimes called an error mitigation code (EMC), and, as an example thereof, asymmetric coding (Asymmetric Coding) or the like is known. The details of error-mitigation encoding will be described later.

The ECC unit 14 encodes the user data stored in the non-volatile memory 20 to generate a code word. In the present embodiment, the ECC unit 14 performs error-correcting encoding on the user data prior to the error-mitigation encoding to generate a code word. In addition, the ECC unit 14 decodes the received word, which is read from the non-volatile memory 20 and is subjected to the error-mitigation decoding by the error-mitigation encoding/decoding unit 16, to restore the user data. The ECC unit 14 includes an ECC encoder 17 and an ECC decoder 18. The encoding and decoding in the ECC unit 14 is the encoding and decoding on the error correction code of the user data. Moreover, the data encoded by the ECC unit 14 can include control data or the like used inside the memory controller 10, in addition to the user data.

The write processing according to the present embodiment is now described. The control unit 11 instructs the ECC encoder 17 to encode the user data upon writing to the non-volatile memory 20. In this event, the control unit 11 decides the storage location (storage address) of a code word in the non-volatile memory 20 and dictates the memory I/F 13 of the decided storage location.

The ECC encoder 17 encodes the user data of the data buffer 12 to generate a code word on the basis of the instruction from the control unit 11. As a scheme for encoding the error correction code, an encoding scheme using an algebraic code like Bose-Chaudhuri-Hocquenghem (BCH) or Reed-Solomon (RS) codes, or an encoding scheme using a sparse graph-based code like low-density parity-check (LDPC) code can be employed.

In executing the error-mitigation encoding, the control unit 11 instructs the error-mitigation encoding/decoding unit 16 to perform the error-mitigation encoding on the user data. The error-mitigation encoding/decoding unit 16 performs the error-mitigation encoding on the code word generated by the ECC encoder 17 on the basis of the instruction from the control unit 11. The memory I/F 13 performs control to store the code word to be subjected to the error-mitigation encoding in the storage location on the non-volatile memory 20 instructed by the control unit 11.

The processing executed upon reading from the non-volatile memory 20 according to the present embodiment is now described. The control unit 11 specifies, upon reading from the non-volatile memory 20, an address on the non-volatile memory 20 and instructs the memory I/F 13 to perform the reading. In the case where the error-mitigation decoding is executed, the control unit 11 instructs the error-mitigation encoding/decoding unit 16 to perform the error-mitigation decoding on the received word read from the non-volatile memory 20. The memory I/F 13 reads the received word from the specified address of the non-volatile memory 20 in response to the instruction from the control unit 11 and inputs the read received word to the error-mitigation encoding/decoding unit 16. In addition, the control unit 11 instructs the ECC decoder 18 to start the decoding. The ECC decoder 18 decodes the received word that is subjected to the error-mitigation decoding by the error-mitigation encoding/decoding unit 16.

The error-mitigation encoding is now described. Although the description below is given of an exemplary case where the memory cell is TLC, a similar procedure is applicable to memory cells such as SLC or other MLC.

In the case where the memory cell is TLC, a 3-bit data value is associated with each of eight threshold voltage distribution states of Er, A, B, C, D, E, F, and G states. This association is referred to as data coding. The data coding is predetermined. Upon data writing (programming), an electric charge is injected into the memory cell so that the state (threshold voltage) corresponds to the data value to be stored according to the data coding. In the case where the memory cell is TLC, one memory cell group corresponds to three pages. The three bits that are storable in each memory cell individually correspond to these three pages. These three pages are hereinafter referred to as a lower page (LOWER), a middle page (MIDDLE), and an upper page (UPPER). FIG. 2 is a diagram illustrating an example of data coding.

In the error-mitigation encoding, bits are inverted in units of pages. In addition, the data is converted in accordance with the pattern having the minimal cost among patterns of the page in which bits are inverted. Given that the number of pages is n, the number of patterns is $2^n$. In one example, in the case where the memory cell is TLC, the number of patterns is eight because n=3, as follows.

(P0) No page to be inverted
(P1) Upper page only
(P2) Middle page only
(P3) Lower page only
(P4) Upper page and middle page
(P5) Upper page and lower page
(P6) Middle page and lower page
(P7) All pages (upper page, middle page, and lower page)

The cost indicates the degree of error susceptibility of data. In one example, the smaller the cost value, the less error-prone the data. The cost is decided on the basis of at least some pieces of information indicated below as follows:

(A1) Number of adjacent Er and G states. The cost is calculated so that the smaller the number, the smaller the value.

(A2) Number of Er states. The cost is calculated so that the larger the number, the smaller the value.

(A3) Number of memory cells programmed to a threshold voltage (e.g., G state) with unsatisfactory properties for cell exhaustion and bit error rate (BER). The cost is calculated so that the smaller the number, the smaller the value.

The details of the function of the error-mitigation encoding/decoding unit 16 are now described. FIG. 3 is a block diagram illustrating an exemplary functional configuration of an error-mitigation encoding/decoding unit 16. As illustrated in FIG. 3, the error-mitigation encoding/decoding unit 16 includes an encoder 210 and a decoder 220.

The encoder 210 executes the error-mitigation encoding. The encoder 210 includes a cost calculation unit 211 and a conversion unit 212. The cost calculation unit 211 calculates the cost of each of a plurality of patterns. The conversion unit 212 converts the data according to the pattern having the minimal cost. The encoder 210 attaches to each page information (an EMC flag) indicating whether or not the bit is inverted. In one example, in the case where the EMC flag is set to "0", it indicates that the bit is not inverted. In the case where the EMC flag is set to "1", it indicates that the bit is inverted. The EMC flag corresponds to page determination information indicating whether or not the value is changed by the error-mitigation encoding. The data having the EMC flag of all pages is hereinafter referred to as flag data (corresponding to determination information).

The decoder 220 executes the error-mitigation decoding. The decoder 220 includes a determination unit 221 and an inverse conversion unit 222. The determination unit 221 refers to the EMC flag and determines whether or not the bits of each page are inverted. The inverse conversion unit 222 inverts the bits of the received word corresponding to the page determined to be inverted.

Figure 4:
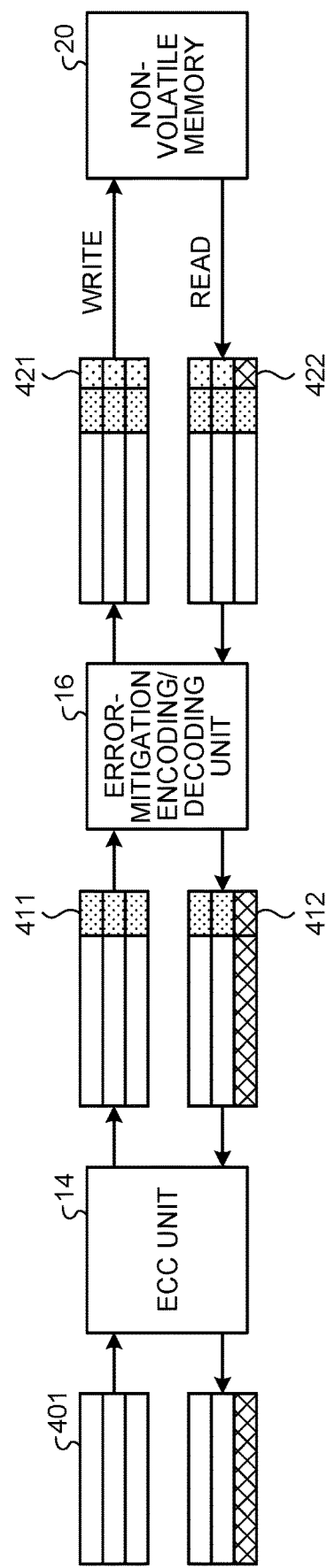
FIG. 4 is a diagram illustrated to describe an example of a burst error caused by an error of an EMC flag itself.

In the case where an error occurs in the EMC flag itself upon reading, a burst error will occur. FIG. 4 is a diagram illustrated to describe an example of a burst error caused by an error of an EMC flag itself. As described above, in the present embodiment, the error-correcting encoding is executed prior to the error-mitigation encoding.

In one example, the ECC unit 14 executes the error-correcting encoding on user data 401 and outputs a code word to which an error correction code 411 is attached. Then, the error-mitigation encoding/decoding unit 16 executes the error-mitigation encoding on the code word to which the error correction code 411 is attached and outputs the code word to which flag data 421 is attached.

Upon reading, the code word (received word) to which the flag data 421 is attached is initially read from the non-volatile memory 20. In this event, in one example, it is assumed that an error occurs in an EMC flag 422 of the lower page. The error-mitigation encoding/decoding unit 16 executes the error-mitigation decoding on the received word read from the non-volatile memory 20. The data obtained by executing the error-mitigation decoding is hereinafter referred to as a code block. The code block includes the user data and the error correction code. The EMC flag 422 is erroneous, so a code block 412 of the lower page has a bit inverted value with respect to the correct value. In other words, the entire code block 412 having the error correction code is erroneously decoded. Thus, even if the ECC unit 14 executes the error-correcting decoding, the user data fails to be restored, causing a burst error.

In the case where the order is such that the error-mitigation encoding/decoding unit 16 executes the error-mitigation encoding and then the ECC unit 14 executes the error-correcting encoding, even if an error occurs in the EMC flag, the burst error as described above does not occur if it is correctable by the error correction code.

Thus, the memory system 1 according to the present embodiment detects an error in the EMC flag, and if there is an error in the EMC flag, corrects the EMC flag to a correct value.

Figure 5:
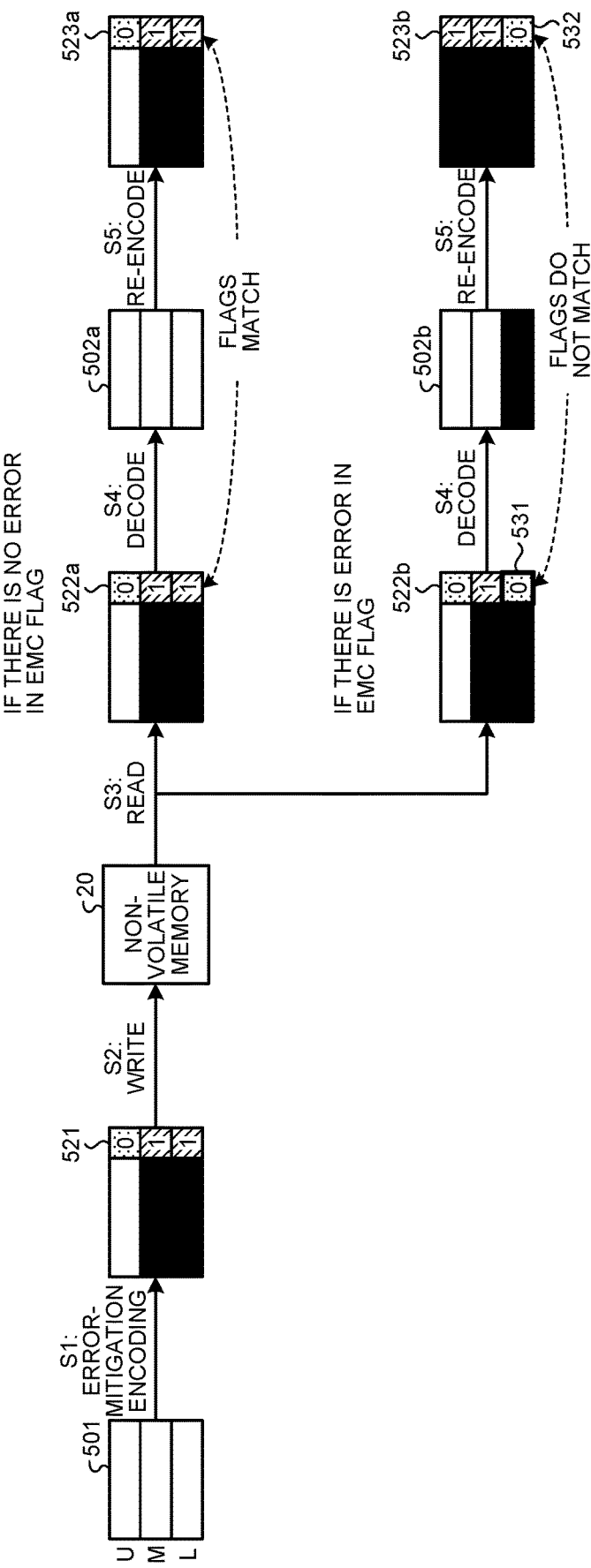
FIG. 5 is a diagram illustrated to describe an overview of processing for detecting an error in the EMC flag.

FIG. 5 is a diagram illustrated to describe an overview of processing for detecting an error in the EMC flag. In FIG. 5, U, M, and L represent an upper page, a middle page, and a lower page, respectively. In addition, the page in black represents a page in which data is converted by the error-mitigation encoding (the same applies to FIGS. 11, 12, and 15 described later).

Upon writing, the encoder 210 executes the error-mitigation encoding on a code block 501 to obtain flag data 521 having the correct EMC flag (step S1). The data after the error-mitigation encoding is written to the non-volatile memory 20 (step S2).

Upon reading, the memory controller 10 reads the received word from the non-volatile memory 20 (step S3). The decoder 220 executes the error-mitigation decoding on the read received word (step S4). If flag data 522a is read correctly, a correct code block 502a is obtained.

In the present embodiment, the encoder 210 then executes the error-mitigation encoding once more for the code block 502a (step S5). The error-mitigation encoding to be re-executed is hereinafter referred to as re-encoding. From the correct code block 502a, a correct flag data 523a can be obtained by the re-encoding.

The control unit 11 compares the flag data 522a included in the received word read from the non-volatile memory 20 with the flag data 523a obtained by the re-encoding and, if they match, outputs a comparison result indicating that there is no error in the EMC flag.

On the other hand, it is assumed that flag data 522b is erroneously read. FIG. 5 illustrates an example in which an EMC flag 531 corresponding to the lower page among the EMC flags included in the flag data 522b does not match an EMC flag 532 corresponding to the lower page in the flag data 523a.

The error-mitigation decoding for the flag data 522b (step S4) obtains an erroneous code block 502b. The encoder 210 executes the re-encoding on the code block 502b (step S5). From the erroneous code block 502b, erroneous flag data 523b is obtained by the re-encoding.

The control unit 11 compares the flag data 522b included in the received word read from the non-volatile memory 20 with the flag data 523b obtained by the re-encoding and, if they do not match, outputs a comparison result indicating that there is an error in the EMC flag.

Figure 6:
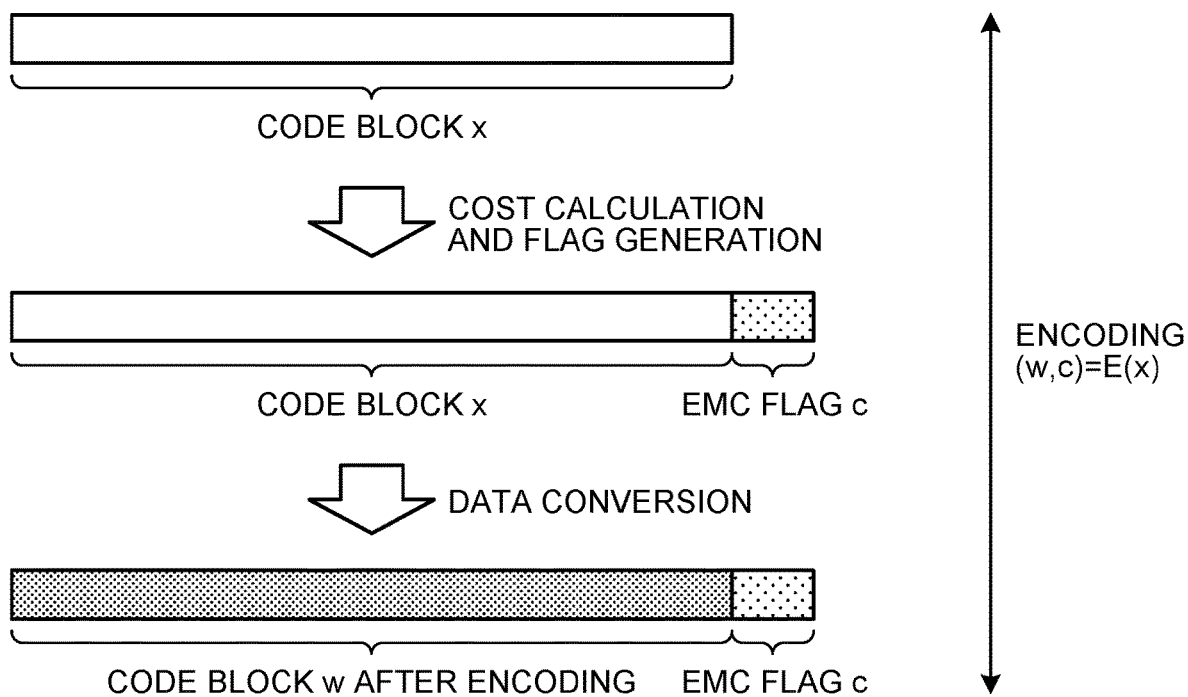
FIG. 6 is a diagram illustrating an example of terms and formulas used for describing error-mitigation encoding upon writing.
Figure 7:
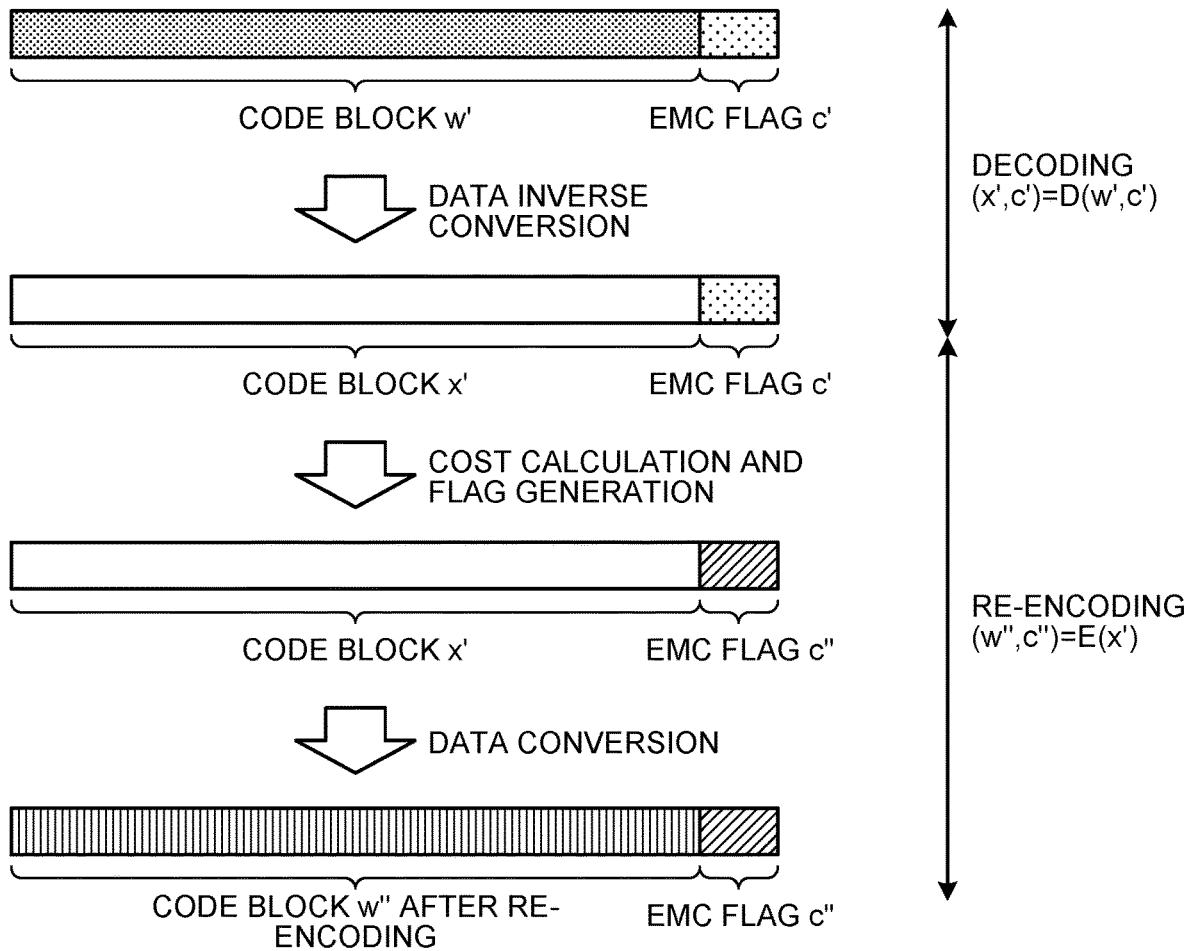
FIG. 7 is a diagram illustrating an example of terms and formulas used for describing error-mitigation encoding/decoding and re-encoding upon reading.

The terms and formulas used in the description below are now described. FIG. 6 is a diagram illustrating an example of terms and formulas used for describing error-mitigation encoding upon writing. FIG. 7 is a diagram illustrating an example of terms and formulas used for describing error-mitigation encoding/decoding and re-encoding upon reading.

As illustrated in FIG. 6, the data to be subjected to the error-mitigation encoding is represented as a code block x. The EMC flag obtained by executing the error-mitigation encoding on the code block x is represented as an EMC flag c. The data converted according to the EMC flag c is represented as a code block w after encoding. The code word having the code block w after encoding and the EMC flag c is written to the non-volatile memory 20. The error-mitigation encoding can be expressed by Formula (1) below, where E( ) is a function that represents the error-mitigation encoding.

$$(w,c)=E(x) \qquad (1)$$

As illustrated in FIG. 7, the code word read from the non-volatile memory 20 is represented as a code block w' and an EMC flag c'. The code word obtained by performing the error-mitigation decoding on this code word is represented as a code block x' and the EMC flag c'. The error-mitigation decoding can be expressed by Formula (2) below, where D( ) is a function that represents the error-mitigation decoding.

$$(x',c')=D(w',c') \qquad (2)$$

The EMC flag obtained by executing the re-encoding on the code block x' obtained by the error-mitigation decoding is represented as an EMC flag c''. The data converted according to the EMC flag c'' is represented as a code block w'' after encoding. The re-encoding can be expressed by Formula (3) below.

$$(w'',c'')=E(x') \qquad (3)$$

Figure 8:
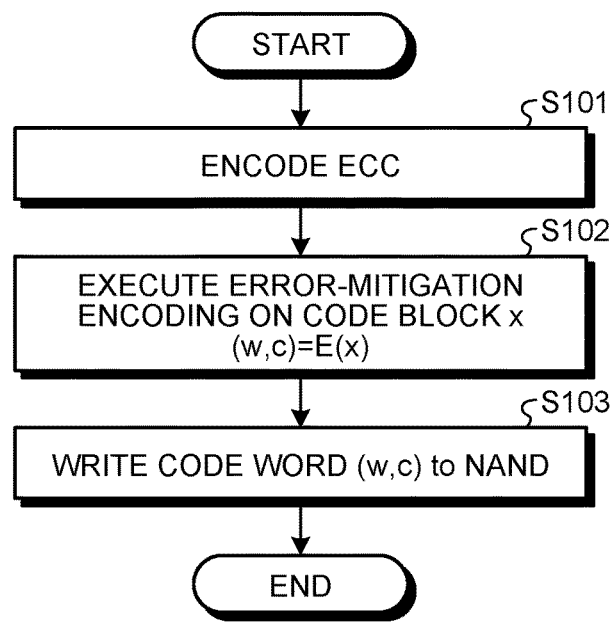
FIG. 8 is a flowchart illustrating an example of encoding processing.

The procedure of the encoding processing of the present embodiment is now described. FIG. 8 is a flowchart illustrating an example of encoding processing.

The ECC encoder 17 in the ECC unit 14 encodes user data and generates a code block x having the user data and an error correction code (step S101).

The encoder 210 in the error-mitigation encoding/decoding unit 16 executes the error-mitigation encoding on the code block x and generates a code word (w, c) having the code block w after encoding and the EMC flag c (step S102).

The memory I/F 13 writes the generated code word (w, c) to the non-volatile memory 20 (step S103) and ends the encoding processing.

Figure 9:
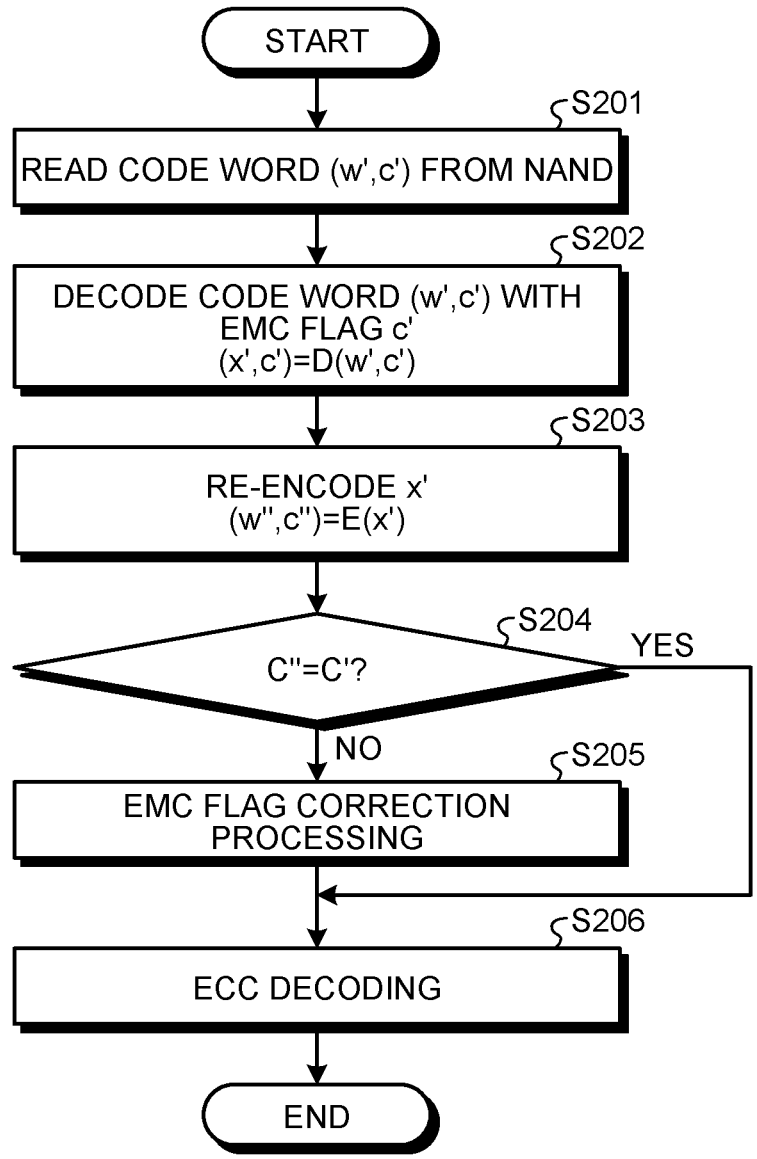
FIG. 9 is a flowchart illustrating an example of decoding processing.

The procedure of the decoding processing of the present embodiment is now described. FIG. 9 is a flowchart illustrating an example of decoding processing.

The memory I/F 13 reads the code word (w', c') from the non-volatile memory 20 (step S201).

The decoder 220 in the error-mitigation encoding/decoding unit 16 executes the error-mitigation decoding on the code word (w', c') and outputs the code word (x', c') having the code block x' and the EMC flag c' (step S202).

The encoder 210 in the error-mitigation encoding/decoding unit 16 executes the re-encoding on the code block x' and generates a code word (w'', c'') having the code block w'' after encoding and the EMC flag c'' (step S203).

The control unit 11 determines whether or not the EMC flag c'' and the EMC flag c' match (step S204). If they do not match (step S204: No), the EMC flag correction processing is executed (step S205). The comparison between the EMC flags is executed for all pages, and if there is even one page that does not match, the EMC flag correction processing is executed (the same applies to FIG. 10 described later). The details of the EMC flag correction processing will be described later.

After the EMC flag correction processing is executed, or if the EMC flag c'' and the EMC flag c' match (step S204: Yes), the ECC decoder 18 in the ECC unit 14 executes the error-correcting decoding on the code block obtained by executing the error-mitigation decoding and outputs the decoded user data (step S206).

Figure 10:
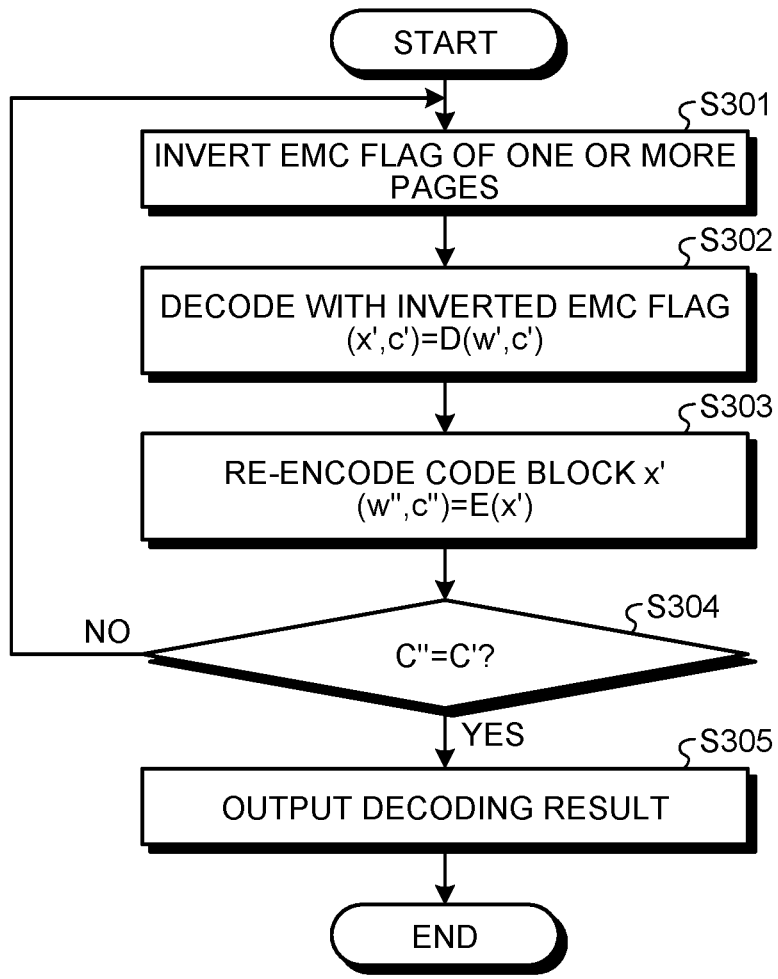
FIG. 10 is a flowchart illustrating an example of EMC flag correction processing.
Figure 11:
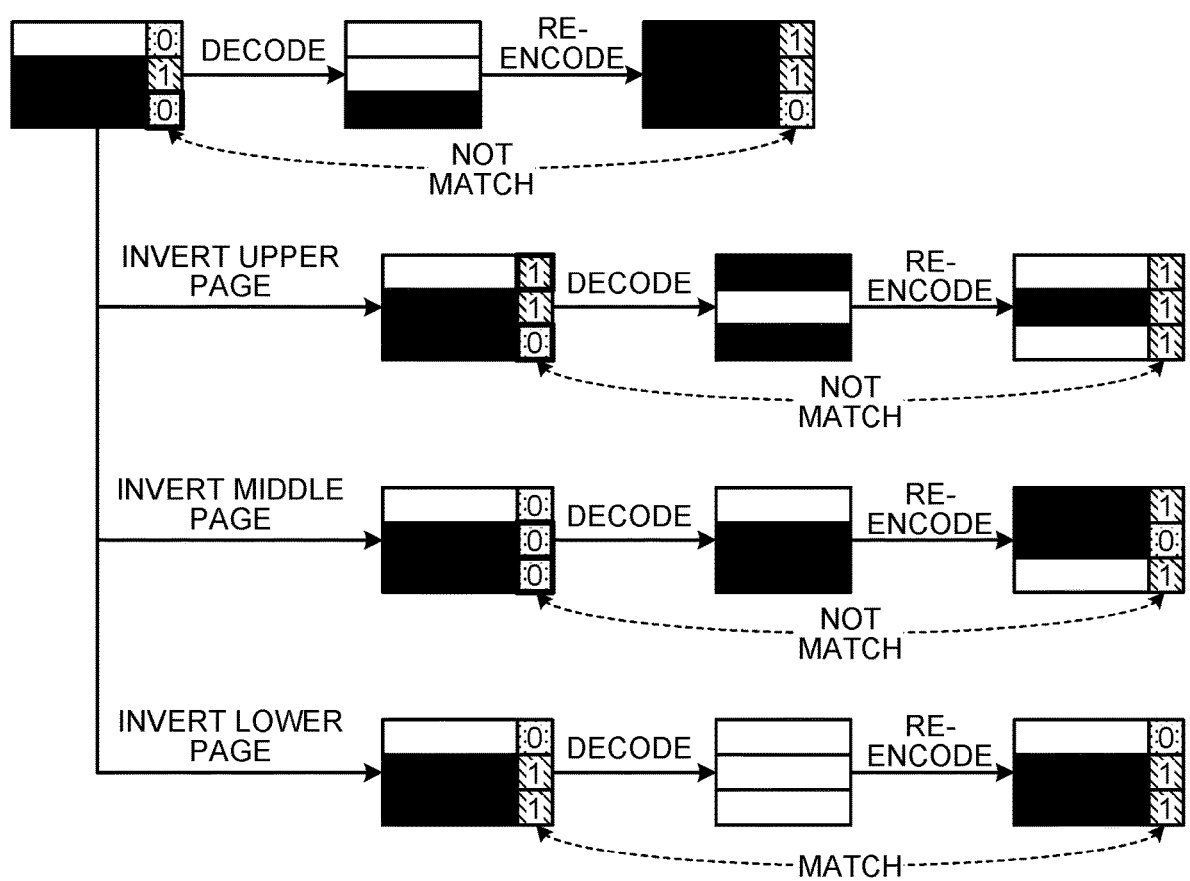
FIG. 11 is a diagram illustrating a specific example of the EMC flag correction processing.

The detailed procedure of the EMC flag correction processing in step S205 is now described. FIG. 10 is a flowchart illustrating an example of EMC flag correction processing. In addition, FIG. 11 is a diagram illustrating a specific example of the EMC flag correction processing.

The control unit 11 inverts the EMC flag of one or more pages (step S301). In one example, the control unit 11 decides a page to invert the EMC flag according to any one of the patterns (P1) to (P7) described above and inverts the flag of the decided page. In one example, in the case of (P1), the control unit 11 inverts the value of the EMC flag on the upper page from "0" to "1" or from "1" to "0". FIG. 11 illustrates an example in which the EMC flag on the upper page is inverted from "0" to "1".

The decoder 220 executes the error-mitigation decoding according to the inverted EMC flag and outputs the code word (x', c') having the code block x' and the EMC flag c' (step S302).

The encoder 210 executes the re-encoding on the code block x' and generates a code word (w", c") having the code block w" after encoding and the EMC flag c" (step S303).

The control unit 11 determines whether or not the EMC flag c" and the EMC flag c" match (step S304). If they do not match (step S304: No), then the processing returns to step S301, and the processing following the inversion of the EMC flag is repeated for another pattern. The EMC flag inverted depending on each pattern corresponds to the change determination information.

If the EMC flag c" and the EMC flag c' match (step S304: Yes), then the decoder 220 outputs the result obtained by the error-mitigation decoding in step S302 (step S305). In this event, the EMC flag c' corresponds to the corrected EMC flag.

FIG. 11 illustrates an example in which the inverted EMC flag on the middle page does not match the EMC flag after re-encoding, but the inverted EMC flag of the lower page matches the EMC flag after re-encoding.

Although FIG. 10 illustrates an example in which the processing is repeated while changing the patterns sequentially, the configuration in which the processing is executed in parallel for the entirety or a part of the plurality of patterns is implementable.

Further, in FIGS. 9 and 10, the EMC flag correction processing (step S205 in FIG. 9, and FIG. 10) is executed subsequent to the processing of detecting the error of the EMC flag (steps S202 to S204 in FIG. 9). However, the configuration in which these processing operations can be executed in parallel is implementable.

Further, the memory system 1 can have a configuration that executes the detection of an error of the EMC flag but does not perform the function of correcting the EMC flag. In this case, the memory system 1 can have a configuration that outputs a result indicating that an error in the EMC flag is detected (comparison result between EMC flags) to the host 30 and causes the host 30 to execute processing depending on the error.

Further, the EMC flag can be corrected using a method different from the method described above. In one example, in the case where a multidimensional error correction code (such as a product code) is used as the error correction code, if an error of the EMC flag is detected, the erasure correction processing using the multidimensional error correction code can be executed.

The re-encoding and the EMC flag correction can be executed in the case where the error-correcting decoding fails. In the example of FIG. 9, if the ECC decoder 18 executes the error-correcting decoding after step S202 and then fails in the error-correction decoding, the processing following step S203 can be executed.

In this way, in the case where a burst error occurs, the memory system according to the first embodiment inverts and decodes the read EMC flag, and executes the error-mitigation encoding once more. In addition, the memory system according to the first embodiment detects an error of the EMC flag itself depending on whether or not the flags before and after the re-encoding match and corrects the EMC flag. This makes it possible to determine whether or not error-mitigation decoding is executed correctly, and it is also possible to correct the EMC flag and execute the error-mitigation decoding.

Second Embodiment

The error included in the user data of the received word read from the non-volatile memory 20 affects the cost calculated upon the re-encoding. Thus, the pattern decided on the basis of the cost can also be affected.

FIG. 12 is a diagram illustrated to describe the effect of a change in costs due to an error in user data. As described above, in the error-mitigation encoding, the data is converted according to the pattern having the minimal cost among $2^n$ patterns (where n is the number of pages).

As illustrated in an encoding example 1201 of FIG. 12, in one example, if the difference between the pattern having the minimal cost and the cost of another pattern (cost difference) is large, even if the user data includes an error, an identical pattern can be decided as the pattern having the minimal cost even upon the re-encoding.

On the other hand, as illustrated in an encoding example 1202 of FIG. 12, there may be an exemplary case where the difference between the pattern having the minimal cost and the cost of another pattern (cost difference) is small. In this case, upon the re-encoding, a pattern that is different from the pattern decided before the re-encoding can be decided as the pattern having the minimal cost.

Thus, a memory system 1-2 according to the present embodiment corrects the EMC flag in consideration of the cost of the user data obtained by the re-encoding.

Figure 13:
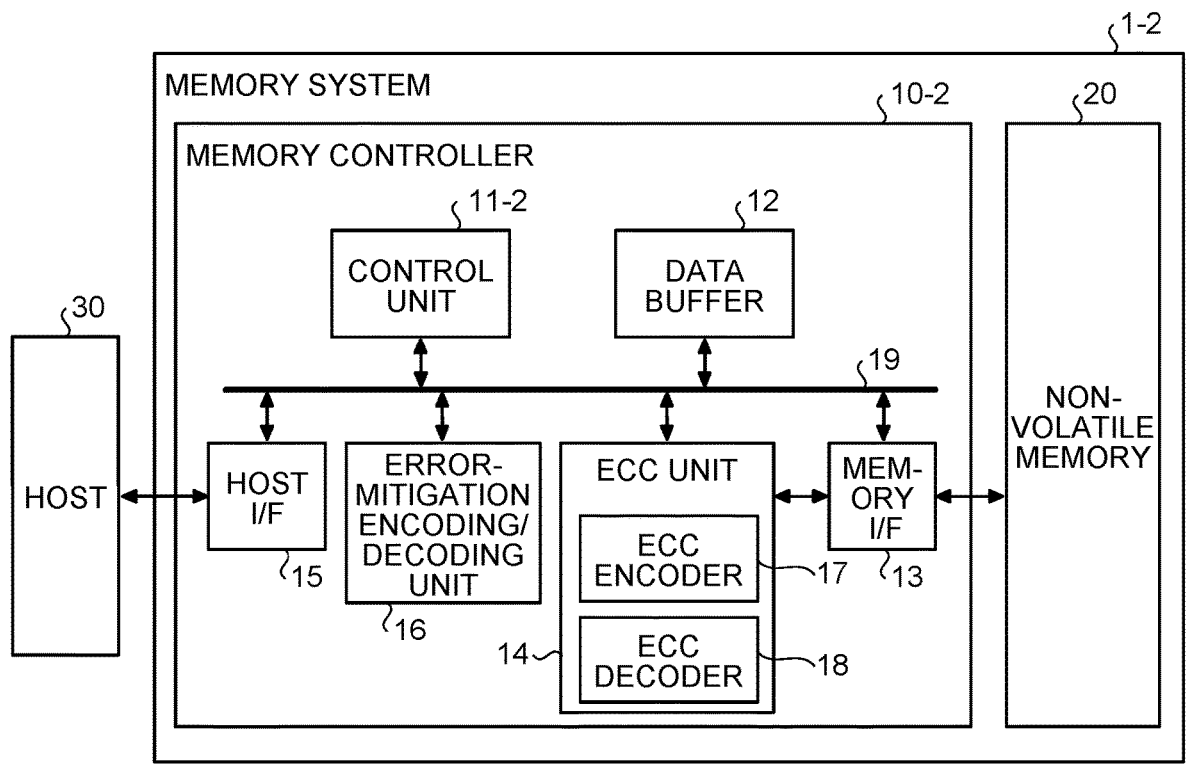
FIG. 13 is a block diagram illustrating an exemplary schematic configuration of a memory system according to a second embodiment.

FIG. 13 is a block diagram illustrating an exemplary schematic configuration of the memory system 1-2 according to the present embodiment; As illustrated in FIG. 13, in the present embodiment, the function of a control unit 11-2 in a memory controller 10-2 of the memory system 1-2 is different from that of the first embodiment. Other configurations and functions are similar to those in FIG. 1, which is the block diagram of the memory system 1 according to the first embodiment. Thus, the same reference numerals are given, and the description thereof will be omitted here.

The control unit 11-2 executes inversion, decoding, and re-encoding on the EMC flags for each of the plurality of patterns and outputs, as the corrected EMC flag, the EMC flag corresponding to the pattern having the minimal cost.

Figure 14:
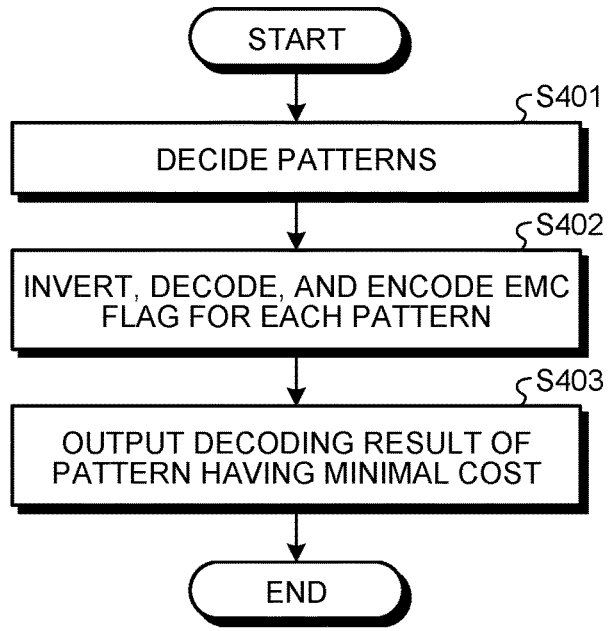
FIG. 14 is a flowchart illustrating an example of EMC flag correction processing of the second embodiment.
Figure 15:
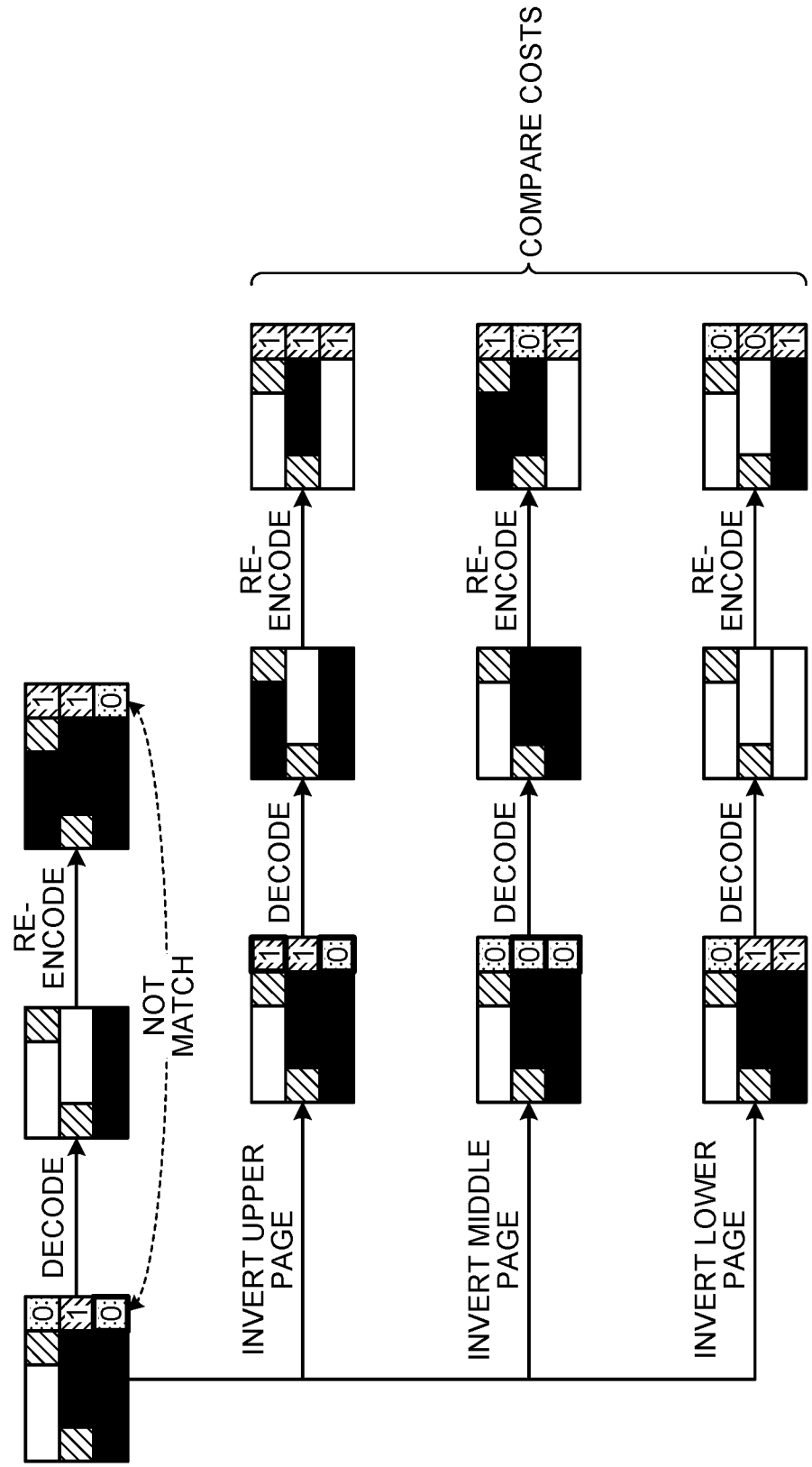
FIG. 15 is a diagram illustrating a specific example of the EMC flag correction processing.

In the present embodiment, the EMC flag correction processing (step S205 in FIG. 9) in the decoding processing is different from that of the first embodiment. The EMC flag correction processing of the present embodiment is now described. FIG. 14 is a flowchart illustrating an example of EMC flag correction processing of the present embodiment. In addition, FIG. 15 is a diagram illustrating a specific example of the EMC flag correction processing.

The control unit 11-2 decides two or more patterns out of the plurality of patterns (step S401). In one example, in the case where the memory cell is TLC, the control unit 11-2 decides two or more of the seven types of patterns (P1) to (P7) described above. The number of patterns to be decided can be set in any number. In one example, in the case where the possibility of an error occurring in the EMC flags corresponding to two or more pages is low, the control unit 11-2 can decide patterns (P1), (P2), and (P3), which are patterns having only one page.

The control unit 11-2 executes, for each decided pattern, inversion of the EMC flag, error-mitigation decoding according to the inverted EMC flag, and re-encoding (step S402).

The control unit 11-2 outputs a result obtained by executing the error-mitigation decoding for the pattern having the minimal cost among the respective patterns (step S403). The inverted EMC flag c' corresponding to this pattern corresponds to the corrected EMC flag.

FIG. 15 illustrates an example in which the re-encoding is executed for three respective patterns (P1), (P2), and (P3) to calculate their costs. In any of the patterns, the flag data that matches the flag data before re-encoding is not obtained, but the flag data (EMC flag) corresponding to the pattern having the minimal cost among these patterns is estimated as the flag data after correction.

In this way, in the memory system according to the second embodiment, it is possible to correct the EMC flag in consideration of the cost of the user data after re-encoding.

Third Embodiment

A memory system according to the third embodiment calculates the cost of the user data included in the code word obtained by the error-mitigation decoding and determines whether or not the user data includes an error on the basis of the cost.

Figure 16:
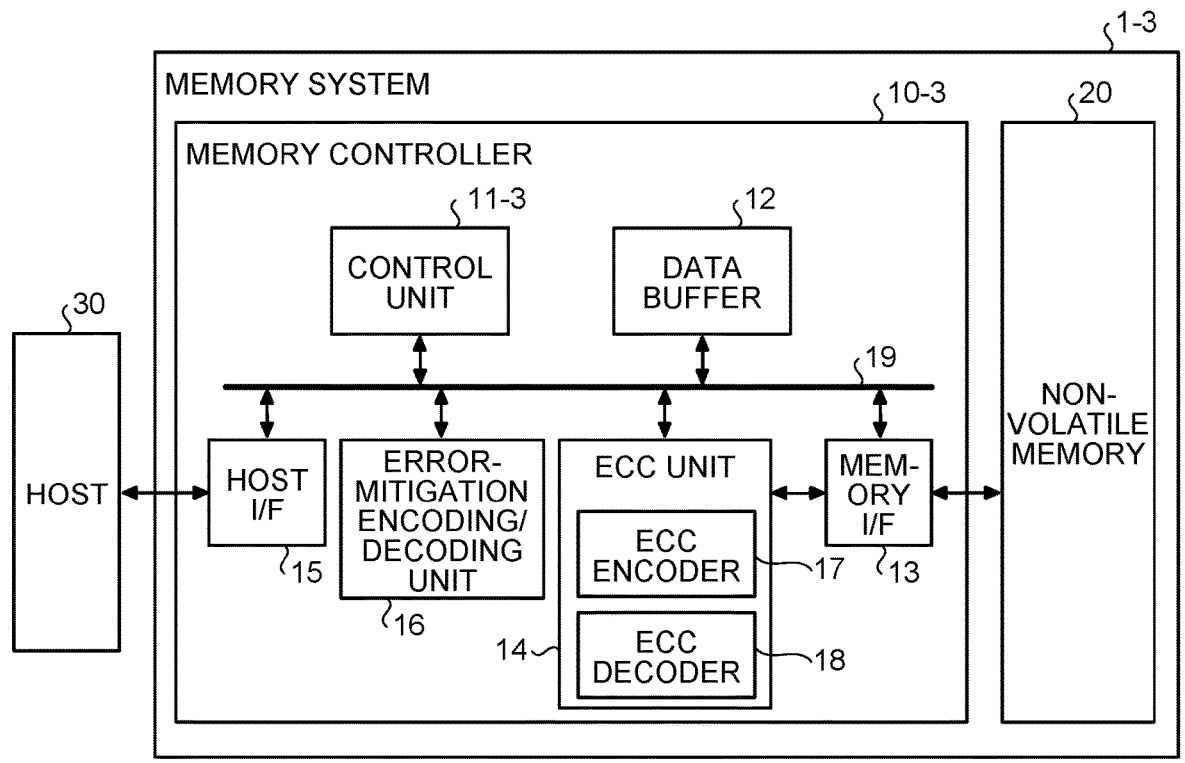
FIG. 16 is a block diagram illustrating an exemplary schematic configuration of a memory system according to a third embodiment.

FIG. 16 is a block diagram illustrating an exemplary schematic configuration of a memory system 1-3 according to the present embodiment. As illustrated in FIG. 16, in the present embodiment, the function of a control unit 11-3 in a memory controller 10-3 of the memory system 1-3 is different from that of the first embodiment. Other configurations and functions are similar to those in FIG. 1, which is the block diagram of the memory system 1 according to the first embodiment. Thus, the same reference numerals are given, and the description thereof will be omitted here.

The control unit 11-3 is different from the memory system of the first embodiment in that it further has a function of calculating the cost of the user data included in the code word obtained by the error-mitigation decoding, a function of determining whether the user data includes an error on the basis of the calculated cost, and a function of switching the EMC flag correction processing in the case where an error is included in the user data.

Figure 17:
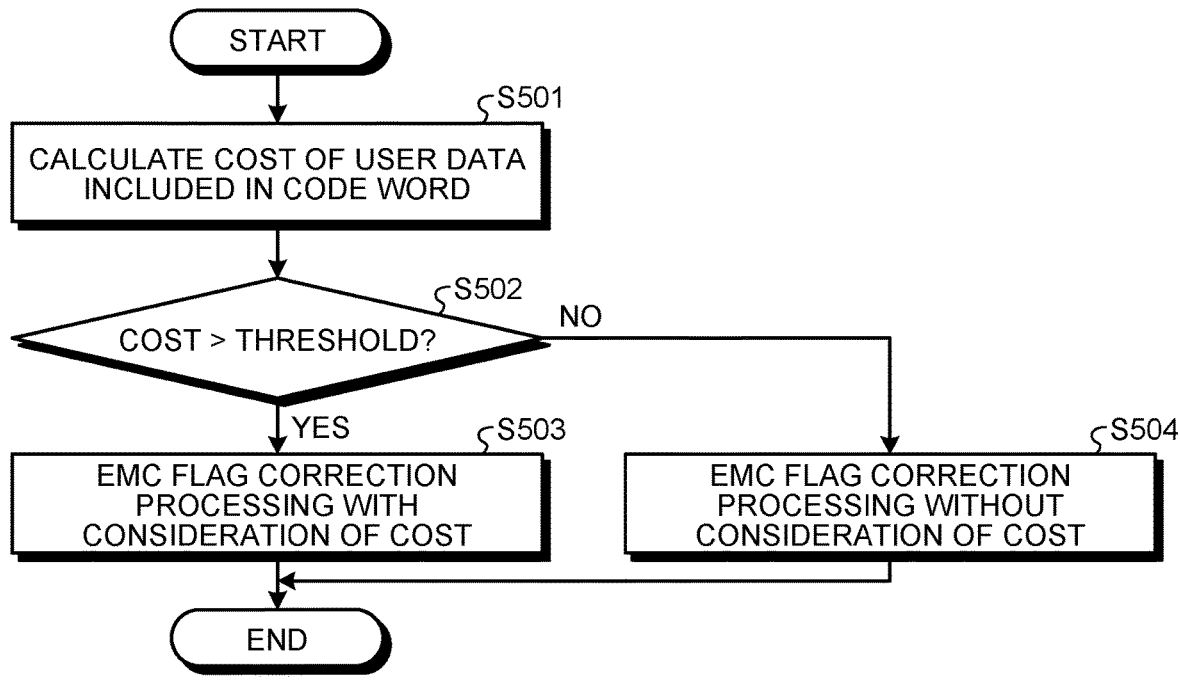
FIG. 17 is a flowchart illustrating an example of EMC flag correction processing of the third embodiment.

In the present embodiment, the EMC flag correction processing (step S205 in FIG. 9) in the decoding processing is different from that of the first embodiment. The EMC flag correction processing of the present embodiment is now described. FIG. 17 is a flowchart illustrating an example of EMC flag correction processing of the present embodiment.

The control unit 11-3 calculates the cost of the user data included in the code word read from the non-volatile memory 20 (step S501). The control unit 11-3 calculates the cost of the user data according to the same calculation method as the cost calculation unit 211. The control unit 11-3 can cause the cost calculation unit 211 to calculate the cost of the user data.

The control unit 11-3 determines whether or not the calculated cost is larger than a predetermined threshold (step S502). If the calculated cost is larger than the threshold (step S502: Yes), the control unit 11-3 determines that the user data includes an error, and executes EMC flag correction processing with consideration of cost (step S503). This processing is the EMC flag correction processing described in the second embodiment, for example. In this case, the control unit 11-3 is configured to be further provided with the function of the control unit 11-2 of the second embodiment.

If the calculated cost is less than the threshold (step S502: No), the control unit 11-3 determines that the user data includes no error, and executes EMC flag correction processing without consideration of cost (step S504). This processing is the EMC flag correction processing described in the first embodiment, for example.

The control unit 11-3 can determine whether the user data includes an error under a condition different from that of the cost calculation unit 211. In one example, in the case where the cost calculation unit 211 calculates the cost according to all of (A1) to (A3) described above, the control unit 11-3 can calculate the cost according to a part of them (e.g., only (A1)).

As described above, according to the first to third embodiments, it is possible to determine whether or not the error-mitigation decoding is executed correctly.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory provided with a plurality of memory cells; and
a memory controller configured to
read data subjected to error-mitigation encoding from the non-volatile memory, the data including first determination information that is determination information indicating whether or not a value is changed by the error-mitigation encoding,
execute error-mitigation decoding on first data that is read from the non-volatile memory,
re-execute the error-mitigation encoding on a decoding result obtained by the error-mitigation decoding, and
compare the first determination information included in the first data with second determination information that is determination information included in data obtained by re-executing the error-mitigation encoding and output a comparison result, wherein
the error-mitigation encoding includes processing of inverting a value of data after error-correcting encoding, and
the error-mitigation decoding includes processing of inverting a value of data before error-correcting decoding.

2. The memory system according to claim 1,
wherein the memory controller is configured to
correct the first determination information in a case where the first determination information and the second determination information do not match.

3. The memory system according to claim 2,
wherein the data corresponds to a plurality of pages, the first determination information and the second determination information each include page determination information indicating whether or not a value is changed by the error-mitigation encoding for each of the plurality of pages, and the memory controller is configured to obtain a plurality of pieces of change determination information in which at least some pieces of the page determination information included in the first determination information are changed, execute the error-mitigation decoding on the first data according to the change determination information, re-execute the error-mitigation encoding on the decoding result obtained by the error-mitigation decoding, and output, as the corrected page determination information, the change determination information that matches the second determination information.

4. The memory system according to claim 2, wherein the data corresponds to a plurality of pages, the first determination information and the second determination information each include page determination information indicating whether or not a value is changed by the error-mitigation encoding for each of the plurality of pages, and the memory controller is configured to obtain a plurality of pieces of change determination information in which at least some pieces of the page determination information included in the first determination information are changed, execute the error-mitigation decoding on the first data according to each of a plurality of pieces of the change determination information, re-execute the error-mitigation encoding on the decoding result obtained by the error-mitigation decoding, and output, as the corrected page determination information, the change determination information having a minimal value of a cost indicating a degree of error susceptibility of data obtained by re-executing the error-mitigation encoding.

5. The memory system according to claim 4, wherein the cost is calculated on a basis of a threshold voltage for each of the plurality of memory cells.

6. The memory system according to claim 2, wherein the data corresponds to a plurality of pages, and the memory controller is configured to calculate a cost indicating a degree of error susceptibility of the first data and determine whether or not the first data includes an error on a basis of the cost.

7. The memory system according to claim 6, wherein the memory controller is configured to determine correction processing on the first determination information depending on whether or not the first data includes the error, and execute the determined correction processing on the first determination information.

8. The memory system according to claim 7, wherein the determined correction processing is one of first correction processing and second correction processing, the first correction processing is based on the cost, and the second correction processing is not based on the cost.

9. The memory system according to claim 1, wherein the memory controller is configured to write the data subjected to the error-mitigation encoding after the error-correcting encoding to the non-volatile memory, and execute the error-correcting decoding on the data obtained by executing the error-mitigation decoding.

10. The memory system according to claim 1, wherein the memory controller is configured to, in a case where the error-correcting decoding fails, re-execute the error-mitigation encoding on the decoding result obtained by the error-mitigation decoding, and compare the first determination information and the second determination information and output a comparison result.

11. The memory system according to claim 1, wherein the error-mitigation encoding is processing of bit flipping of the data.

12. The memory system according to claim 1, wherein the memory system is connectable to a host, and the memory controller is configured to generate second data by performing the error-mitigation encoding on first data based on user data specified by a write request from the host, set information indicating whether or not the second data is changed from the first data as the first determination information, and write third data including the first determination information and the second data to the non-volatile memory as the data.

13. The memory system according to claim 12, wherein the memory controller is configured to read the data from the non-volatile memory on a basis of a read request from the host specifying a logical address of the user data.

14. A method of controlling a non-volatile memory, comprising:

reading data subjected to error-mitigation encoding from the non-volatile memory, the data including first determination information that is determination information indicating whether or not a value is changed by the error-mitigation encoding;

executing error-mitigation decoding on first data that is read from the non-volatile memory;

re-executing the error-mitigation encoding on a decoding result obtained by the error-mitigation decoding; and comparing the first determination information included in the first data with second determination information that is determination information included in data obtained by re-executing the error-mitigation encoding and outputting a comparison result, wherein the error-mitigation encoding includes processing of inverting a value of data after error-correcting encoding, and the error-mitigation decoding includes processing of inverting a value of data before error-correcting decoding.

15. The method according to claim 14, wherein the first determination information is corrected in a case where the first determination information and the second determination information do not match.

16. The method according to claim 15, wherein the data corresponds to a plurality of pages, the first determination information and the second determination information each include page determination information indicating whether or not a value is changed by the error-mitigation encoding for each of the plurality of pages, a plurality of pieces of change determination information in which at least some pieces of the page determination information included in the first determination information are changed is obtained, the error-mitigation decoding is executed on the first data according to the change determination information, the error-mitigation encoding is re-executed on the decoding result obtained by the error-mitigation decoding, and the change determination information that matches the second determination information is output as the corrected page determination information.

17. The method according to claim 15, wherein the data corresponds to a plurality of pages, the first determination information and the second determination information each include page determination information indicating whether or not a value is changed by the error-mitigation encoding for each of the plurality of pages, a plurality of pieces of change determination information in which at least some pieces of the page determination information included in the first determination information are changed is obtained, the error-mitigation decoding is executed on the first data according to each of a plurality of pieces of the change determination information, the error-mitigation encoding is re-executed on the decoding result obtained by the error-mitigation decoding, and the change determination information having a minimal value of a cost indicating a degree of error susceptibility of data obtained by re-executing the error-mitigation encoding is output as the corrected page determination information.

18. The method according to claim 17, wherein the cost is calculated on a basis of a threshold voltage for each of a plurality of memory cells included in the non-volatile memory.

19. The method according to claim 15, wherein the data corresponds to a plurality of pages, and a cost indicating a degree of error susceptibility of the first data is calculated, and whether or not the first data includes an error is determined on a basis of the cost.

20. The method according to claim 19, wherein correction processing on the first determination information is determined depending on whether or not the first data includes the error, and the determined correction processing on the first determination information is executed.

* * * * *